United States Patent
Qian et al.

(10) Patent No.: US 11,233,496 B2
(45) Date of Patent: Jan. 25, 2022

(54) ACOUSTIC RESONATOR AND FILTER WITH ELECTRODE HAVING ZIG-ZAG EDGE AND METHOD FOR PRODUCING THE SAME

(71) Applicant: VANGUARD INTERNATIONAL SEMICONDUCTOR SINGAPORE PTE. LTD., Singapore (SG)

(72) Inventors: You Qian, Singapore (SG); Humberto Campanella Pineda, Singapore (SG); Rakesh Kumar, Singapore (SG)

(73) Assignee: VANGUARD INTERNATIONAL SEMICONDUCTOR SINGAPORE PTE. LTD., Singapore (SG)

(*) Notice: Subject to any disclaimer, the term of this patent is extended or adjusted under 35 U.S.C. 154(b) by 696 days.

(21) Appl. No.: 15/901,531

(22) Filed: Feb. 21, 2018

(65) Prior Publication Data

US 2019/0260346 A1    Aug. 22, 2019

(51) Int. Cl.
| | |
|---|---|
| *H03H 9/02* | (2006.01) |
| *H03H 9/13* | (2006.01) |
| *H03H 9/17* | (2006.01) |
| *H03H 3/02* | (2006.01) |
| *H01L 41/29* | (2013.01) |
| *H01L 41/31* | (2013.01) |
| *H03H 9/54* | (2006.01) |
| *H04B 1/40* | (2015.01) |

(52) U.S. Cl.
CPC ......... *H03H 9/02086* (2013.01); *H01L 41/29* (2013.01); *H01L 41/31* (2013.01); *H03H 3/02* (2013.01); *H03H 9/132* (2013.01); *H03H 9/17* (2013.01); *H03H 9/54* (2013.01); *H04B 1/40* (2013.01)

(58) Field of Classification Search
CPC ........ H03H 9/02086; H03H 9/54; H03H 3/02; H03H 9/17; H03H 9/132; H01L 41/29; H01L 41/31; H04B 1/40
See application file for complete search history.

(56) References Cited

U.S. PATENT DOCUMENTS

| | | |
|---|---|---|
| 6,215,375 B1 | 4/2001 | Larson, III et al. |
| 6,812,619 B1 | 11/2004 | Kaitila et al. |
| 7,466,213 B2 | 12/2008 | Lobl et al. |
| (Continued) | | |

FOREIGN PATENT DOCUMENTS

EP    1887688 A1    2/2008

OTHER PUBLICATIONS

Office Action for the related Taiwanese patent application No. 1071092626, dated Oct. 24, 2018, 7 pages.

(Continued)

*Primary Examiner* — Bryan P Gordon
(74) *Attorney, Agent, or Firm* — Winston Hsu

(57) ABSTRACT

Methods of designing a BAW resonator and filter and the resulting devices are provided. Embodiments include patterning a bottom electrode of a resonator; patterning a top electrode of the resonator; and intersecting areas of the top and bottom electrodes to provide an effective area of the resonator, wherein the effective area includes a closed-loop contour line including a pulse function pattern with predefined amplitude, period and a number of repetitions of pulses along the closed-loop contour line.

9 Claims, 6 Drawing Sheets

(56) References Cited

U.S. PATENT DOCUMENTS

| | | | |
|---|---|---|---|
| 8,008,993 B2 | 8/2011 | Milsom et al. | |
| 9,148,117 B2 | 9/2015 | Burak et al. | |
| 9,246,473 B2 | 1/2016 | Burak et al. | |
| 9,450,565 B2 | 9/2016 | Tajie | |
| 2006/0132262 A1* | 6/2006 | Fazzio | H03H 9/02118 |
| | | | 333/187 |
| 2012/0299444 A1* | 11/2012 | Yokoyama | H03H 9/13 |
| | | | 310/326 |
| 2013/0106248 A1 | 5/2013 | Burak et al. | |
| 2014/0125203 A1 | 5/2014 | Choy et al. | |
| 2015/0349743 A1 | 12/2015 | Burak et al. | |
| 2017/0294893 A1* | 10/2017 | Chang | H03H 9/0211 |

OTHER PUBLICATIONS

Office Action for the related German patent application No. 102018208454.8, dated Nov. 28, 2018, 90 pages.

\* cited by examiner

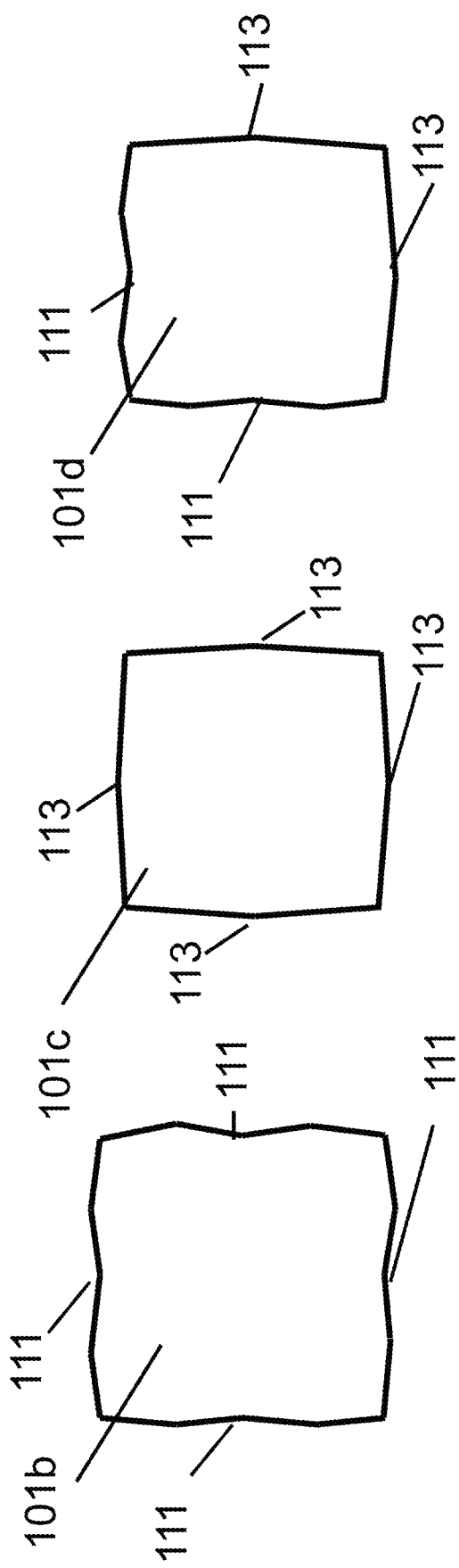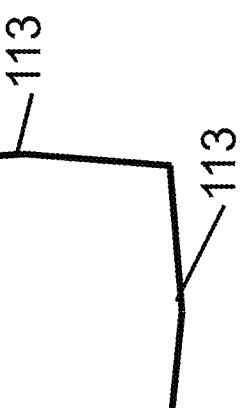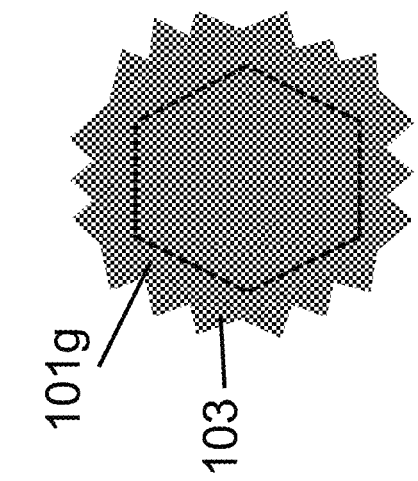
FIG. 1B  FIG. 1C  FIG. 1D
FIG. 1E  FIG. 1F  FIG. 1G

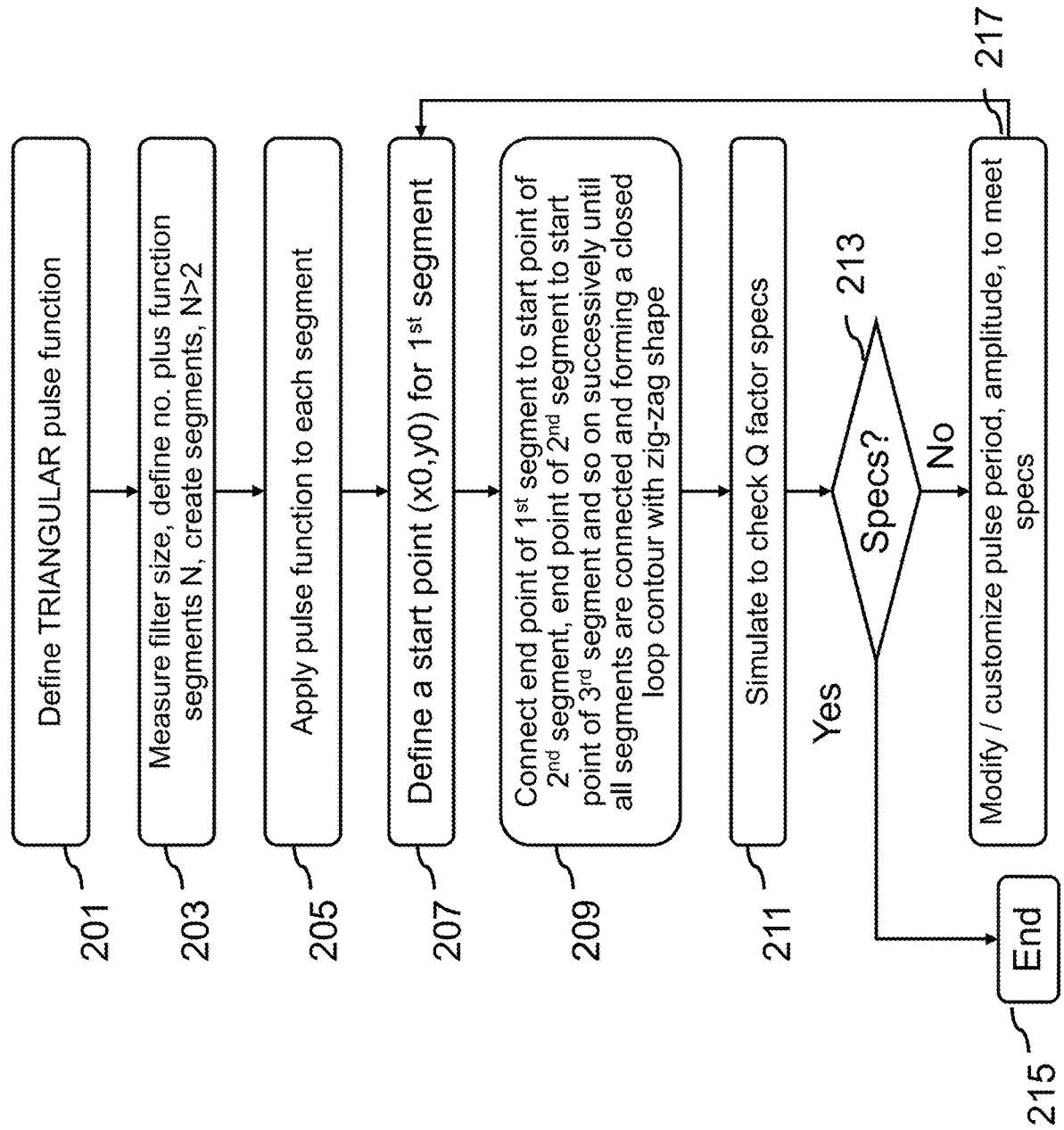

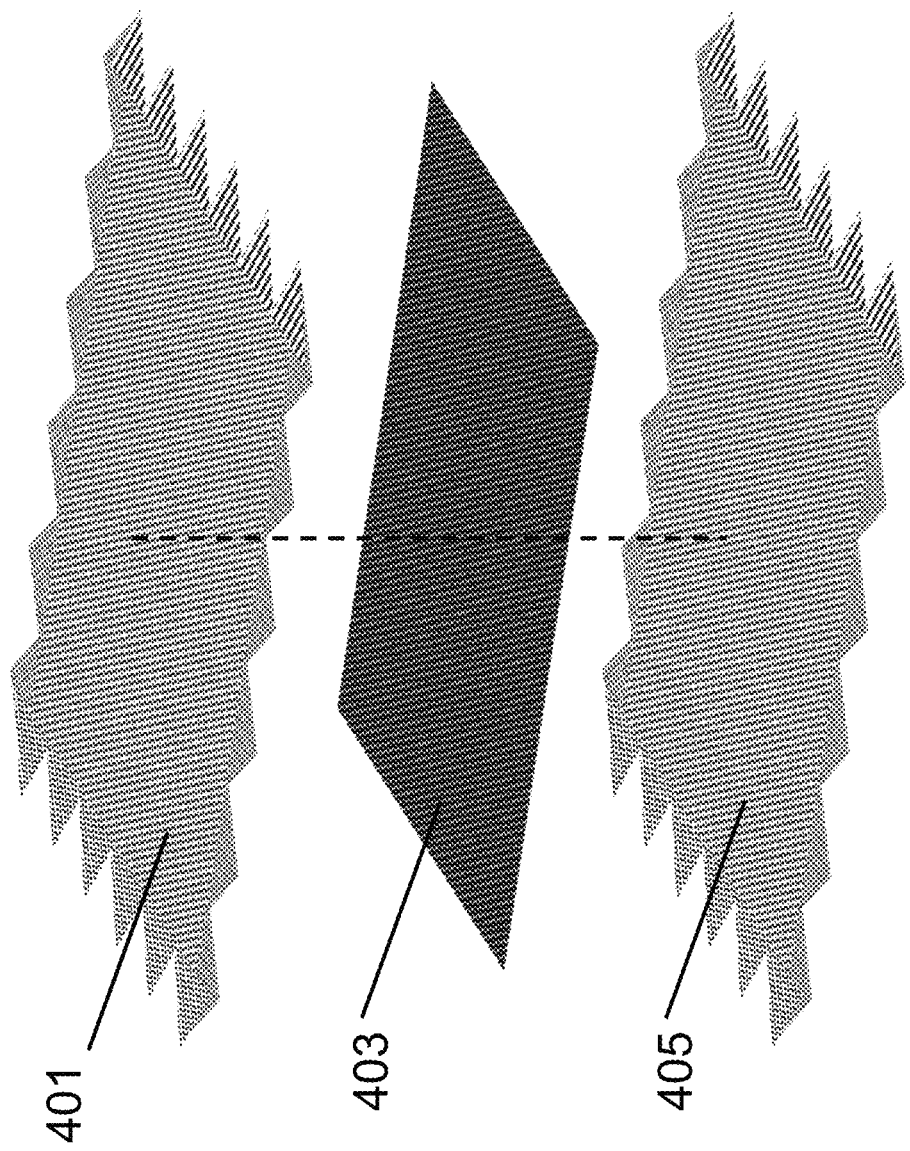

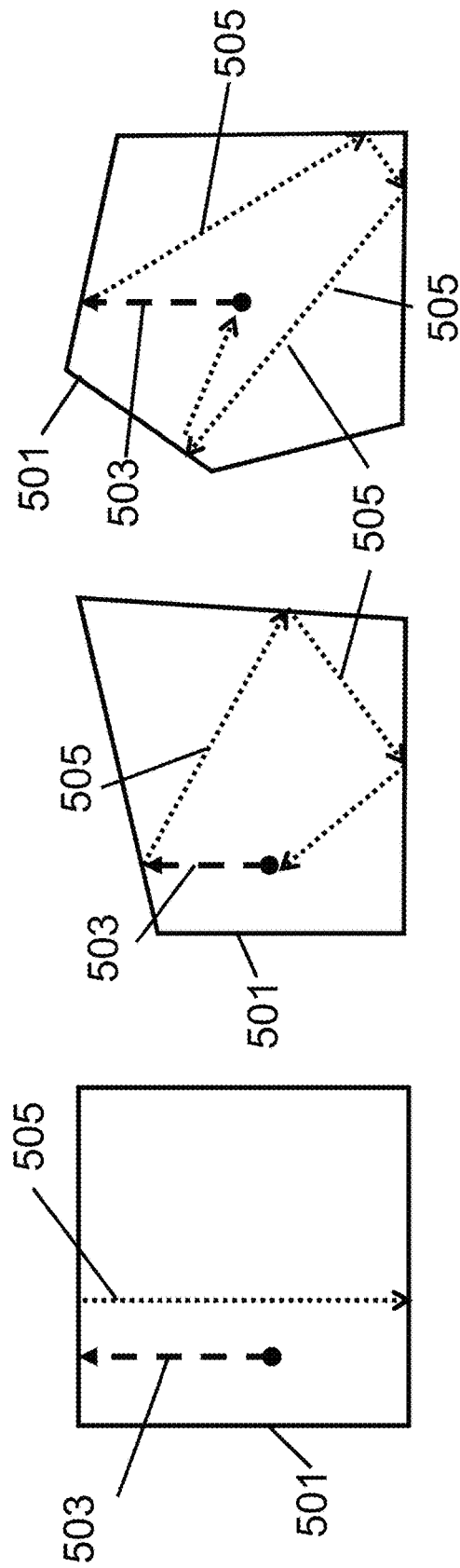
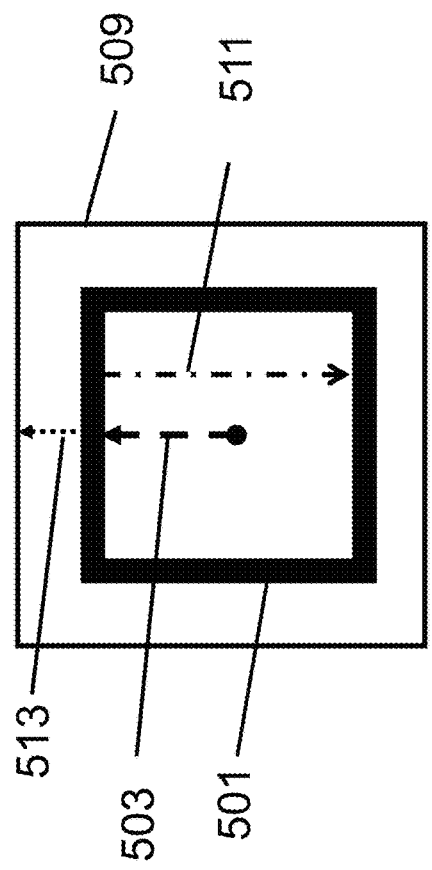
FIG. 5A (PRIOR ART)
FIG. 5B (PRIOR ART)
FIG. 5C (PRIOR ART)
FIG. 5D (PRIOR ART)

ACOUSTIC RESONATOR AND FILTER WITH ELECTRODE HAVING ZIG-ZAG EDGE AND METHOD FOR PRODUCING THE SAME

TECHNICAL FIELD

The present disclosure generally relates to acoustic filters and resonators. The present disclosure is particularly applicable to bulk acoustic wave (BAW) resonators and filters for use in wireless mobile device and small cell applications.

BACKGROUND

BAW resonators, filters and other components are widely used in high frequency applications such as 4G or long term evolution (LTE) communications to remove unwanted frequencies and improve signal quality. With an effective operating frequency range of 2 gigahertz (GHz) to 16 GHz, BAW components also feature the design advantage of requiring decreased size to accommodate higher bandwidths. This limits their circuitry footprint while making them practical for use in demanding 3G, 4G, 4G LTE, 5G and future broadband applications.

However, BAW filters are susceptible to unwanted lateral wave propagation that impacts the quality (Q) factor—a measure of the quality of a filter to selectively filter signals at certain frequencies. Lateral waves also cause BAW filters to exhibit spurious and notorious resonance mode behavior that superposes the target (expected) longitudinal thickness mode. Resultantly, the range of frequencies or wavelengths that pass through the BAW filter are unreliable.

Conventional rectangular shaped electrodes of resonators or filters exhibit deeper penetration of lateral waves when analyzed with interferometry simulation. A more spurious mode is exhibited with conventional rectangular electrodes which also use more kinetic energy and have a reduced Q factor.

FIGS. 5A-5D schematically illustrate, in top view, elements of conventional resonator electrodes. FIG. 5A schematically illustrates an electrode 501 of a resonator having a rectangular shape. The electrode 501 includes straight line edges formed along the perimeter of the electrode 501. The launch wave 503 of electrode 501 is launched and reflected back in a parallel manner as shown by reflected wave 505. This structure produces the shortest path for a lateral wave, shortest lateral wave reflection time and results in higher energy lateral modes.

FIGS. 5B and 5C schematically illustrate, in top view, elements of conventional resonator electrodes in polygon shapes. FIGS. 5B and 5C schematically illustrates an electrode 501 of a resonator having a non-rectangular, polygonal shape where no two sides are parallel to one another. The launch wave 503 of electrode 501 is launched and reflected back at an angle as shown by reflected waves 505. These polygonal shaped electrodes produce a longer path for a lateral wave, longer lateral wave reflection time and results in lower energy lateral modes.

FIG. 5D schematically illustrates an electrode 501 of a resonator having a rectangular shape and including a peripheral ring 509. The peripheral ring 509 is provided as an acoustic absorber to change acoustic boundary conditions. The electrode 501 includes straight line edges formed along the perimeter of the electrode 501. The launch wave 503 of electrode 501 is launched and reflected back as a ring-weakened lateral wave 511. Wave 513 represents the wave that is transmitted beyond the peripheral ring 509. This structure produces a longer path for the ring-weakened lateral wave 511 and results in lower energy lateral modes.

A need therefore exists for methodology enabling formation of a BAW resonator and filter that exhibits a high Q factor and improved lateral wave response and the resulting device.

SUMMARY

An aspect of the present disclosure is a method of designing a BAW resonator having patterned edges that are non-parallel. The edges can be non-parallel straight or non-parallel curve. With respect to the non-parallel curve, polygon rounding is not an issue as electrode size is greater than 100×100 µm² (rounding is negligible compared to features sizes).

Another aspect of the present disclosure is a BAW resonator having electrodes with zig-zag edges.

Yet another aspect of the present disclosure is a zig-zag shaped longitudinal mode BAW resonator.

An aspect of the present disclosure is a method of designing a BAW resonator having patterned edges that achieve higher target Q factor and have a smoother Q-circle with attenuated spurious modes.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: defining a pulse function to create a contour line of a BAW resonator; providing segments of the contour line based on pulse function amplitude, period and contour length; and connecting endpoints of the segments to form a closed-loop contour line enclosing an effective area of the BAW resonator.

Aspects of the present disclosure include further defining the pulse function to achieve a target Q factor of the BAW resonator. Other aspects include forming the closed contour line having a zig-zag shaped contour along a perimeter of a bottom electrode, a top electrode or both of the BAW resonator, or alternatively, forming the closed contour line having a non-parallel curve shaped contour with sinusoidal functions along a perimeter of the bottom electrode, the top electrode or both. Another aspect includes forming the zig-zag shaped contour having triangular functions along the perimeter of the bottom electrode, the top electrode or both. Further aspects include forming the top and bottom electrodes in a rectangular shape or a regular polygon shape. Another aspect includes forming an acoustic layer between the top and bottom electrodes. Yet another aspect includes wherein the acoustic layer includes a piezoelectric material. Further aspects include the BAW resonator includes a longitudinal-mode BAW resonator. Other aspects include the pulse periodic pattern of the contour line having a concave pattern, a convex pattern or a combination of concave and convex patterns along a perimeter of the bottom electrode, the top electrode or both, wherein the top and bottom electrodes include a rectangular shape or a regular polygon shape.

Another aspect of the present disclosure is a device including: a bottom electrode formed over a substrate; an acoustic layer formed over the bottom electrode; a top electrode formed over the acoustic layer, wherein the bottom electrode, the top electrode or both include patterned features whose intersection provides an effective area of a resonator, and wherein the effective area of the resonator includes a closed-loop contour line including a pulse periodic pattern with a pre-defined amplitude, period and number of repetitions of pulses along the closed-loop contour line.

Aspects of the device include the resonator includes one or more longitudinal-mode BAW resonators. Aspects of the present disclosure include the bottom electrode, the top electrode or both has a zig-zag shaped contour along a perimeter of the bottom electrode, the top electrode or both, or alternatively, the bottom electrode, the top electrode or both include a non-parallel curve shaped contour with sinusoidal functions along a perimeter of the bottom electrode, the top electrode or both. Other aspects include the top and bottom electrodes have a rectangular shape or a regular polygon shape, and the acoustic layer includes a piezoelectric material. Another aspect includes the zig-zag shaped contour has triangular functions along the perimeter of the bottom electrode, the top electrode or both. Further aspects include the pulse periodic pattern of the contour line has a concave pattern, a convex pattern or a combination of concave and convex patterns along a perimeter of the bottom electrode, the top electrode or both, wherein the top and bottom electrodes include a rectangular shape or a regular polygon shape.

A further aspect of the present disclosure is a method including: patterning a bottom electrode of a resonator; patterning a top electrode of the resonator; and intersecting areas of the top and bottom electrodes to provide an effective area of the resonator, wherein the effective area includes a closed-loop contour line including a pulse function pattern with pre-defined amplitude, period and a number of repetitions of pulses along the closed-loop contour line.

Aspects of the present disclosure include determining whether a target Q factor is met for the resonator based on analysis of the closed-loop contour line and specification information for the resonator. Additional aspects of the present disclosure include the resonator includes a longitudinal-mode BAW resonator including a zig-zag shaped contour along a perimeter of the bottom electrode, the top electrode or both. Other aspects include an acoustic layer is disposed between the top and bottom electrodes. Another aspect includes the acoustic layer includes a piezoelectric material.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1B through 1G schematically illustrate exemplary shaped electrodes for use in a BAW resonator, in accordance with other exemplary embodiments;

FIG. 2 is a flowchart of a process for designing a BAW resonator having electrodes with zig-zag edge, in accordance with another exemplary embodiment;

FIG. 4 schematically illustrates an exploded view of elements of a BAW resonator having electrodes with zig zag edges, in accordance with a further exemplary embodiment; and FIGS. 5A-5D schematically illustrate, in top view, elements of conventional resonator electrodes.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of BAW components, such as resonators and filters, being susceptible to unwanted lateral waves that degrade performance. The problem is solved, inter alia, by forming a BAW resonator featuring rectangular electrode(s) or regular polygon shape(s) with a zig-zag edge. The present disclosure further addresses and solves the problem of designing BAW components with improved Q factor. The problem is solved, inter alia, by determining a target Q factor to be met based on an effective area of a closed-loop contour line having non-parallel curves or non-parallel edges (such a zig-zag edges).

Methodology in accordance with embodiments of the present disclosure includes defining a pulse function to create a contour line of a BAW resonator; providing segments of the contour line based on pulse function amplitude, period and contour length; and connecting endpoints the segments to form a closed-loop contour line enclosing an effective area of the BAW resonator. Other methodology in accordance with embodiments of the present disclosure includes patterning a bottom electrode of a resonator; patterning a top electrode of the resonator; and intersecting areas of the top and bottom electrodes to provide an effective area of the resonator, wherein the effective area includes a closed-loop contour line including a pulse function pattern with pre-defined amplitude, period and a number of repetitions of pulses along the closed-loop contour line.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
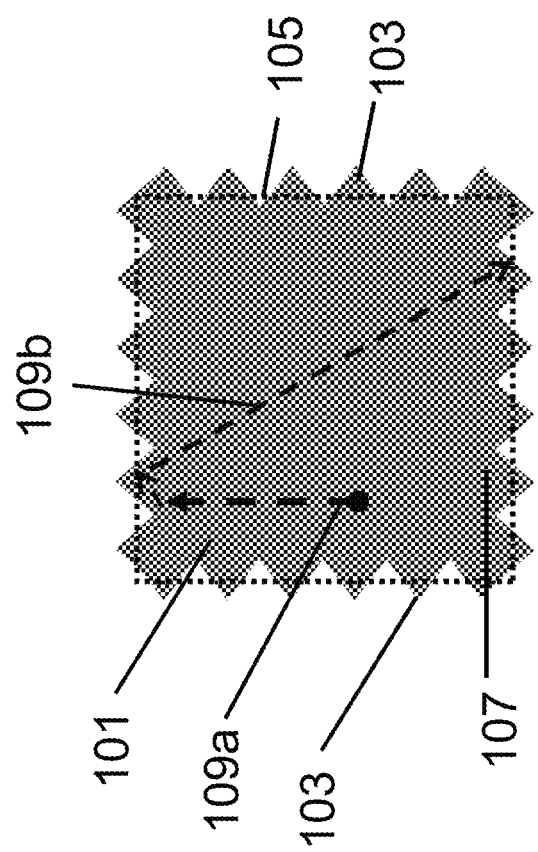
FIG. 1A schematically illustrates, in top view, elements of a BAW resonator having an electrode with a zig-zag edge, in accordance with an exemplary embodiment.

FIG. 1A schematically illustrates an electrode 101 of a BAW resonator having a rectangular or square shape. In alternative embodiments, the electrode can be a regular polygon shape, including a pentagon (FIG. 1E), hexagon (FIG. 1G), etc. The electrode 101 includes zig-zag edge 103 formed along the perimeter 105 of the electrode 101. The deep indents of the triangular shaped edges provide a concave pattern. The area 107 includes the area within the perimeter 105 of the electrode 101. In the exemplary embodiment, the resulting region enclosed by the zig-zag edge (i.e. a closed-loop contour line) is representative of an area of an electrode. The zig-zag edge 103 minimizes the unwanted lateral wave propagation of conventional BAW resonators or filters. The launch wave 109a of an electrode 101 with zig-zag edges 103 is resonated off the triangular shaped pattern of the zig-zag edge at an angle with reflected waves 109b. Thus, the zig-zag edge 103 impacts standing waves resonated in an adjacent acoustic layer (not shown for illustrative convenience). Conventional wave would resonate back in a parallel manner, i.e. in a straight line.

The electrode 101 is made of a conductive material, the electrode 101 having a patterned zig-zag edge. The area of the resonator may be defined by a closed-loop contour line representative of the area of the first electrode 101, the closed-loop contour line having the zig-zag edge 103. The dimensions of the zig-zag edge are etched into the electrode 101 throughout its thickness for impacting standing waves resonated through an acoustic layer adjacent to the electrode 101. The depth of the valleys of the triangular portions can be etched to varying amounts including about 100 nm up to 50 µm. The electrode 101 interfaces with the acoustic layer which is formed of a thin-film piezoelectric material.

Figure 3:
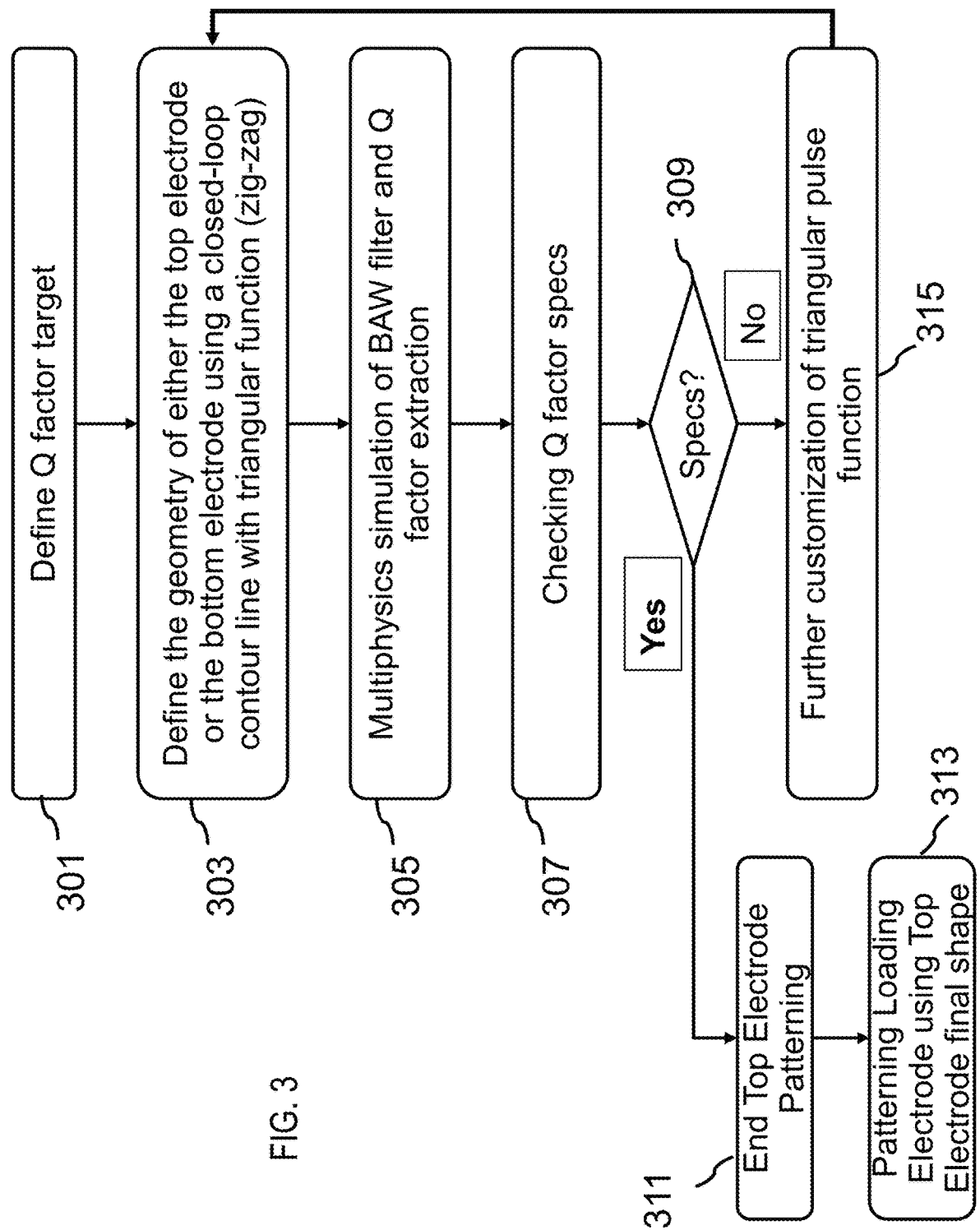
FIG. 3 is a flowchart of a process for improving the Q factor of a BAW resonator, in accordance with another exemplary embodiment.

FIGS. 1B-1G are examples of alternative shaped electrodes 101b, 101c, 101d and 101e in accordance with the present disclosure which can also be used in the process flowcharts of FIGS. 3 and 4 described further herein. The electrode 101b of FIG. 1B provides a wider indentations 111 compared to the zig-zag pattern of FIG. 1A. The indentations 111 of this example provide a concave shape. In FIG. 1C, the electrode 101c has wider protrusions 113 which make the electrode 101c have a convex shape. In FIG. 1D, the electrode 101d contains a combination of indentations 111 and protrusions 113 making it both a concave and convex shape. The non-parallel edges of the edge in FIGS. 1B-1D improve performance of the BAW filter or resonator. In FIG. 1E, the electrode 101e has a sinusoidal shaped edge 115. The non-parallel curves of the sinusoidal shaped edge 115 improve performance of the BAW filter or resonator. The zig-zag pattern 103 of electrodes 101f and 101g in FIGS. 1F and 1G, respectively, are in the overall shape of a regular polygons, such as, but not limited to a pentagon (FIG. 1F) and hexagon (FIG. 1G). As will be discussed further herein, the inclusion of the nonparallel edges or non-parallel curves within the design and fabrication of an electrode of a BAW resonator results in an improved Q factor.

Exemplary performance metrics for a BAW resonator having the foregoing dimensions discussed above with respect to FIGS. 1A-1E are now discussed. The Q factor of a filter or other tuned circuit provides an indication of its performance in a high frequency environment. Specifically, the Q factor indicates the energy losses within a BAW filter, i.e., made up of multiple BAW resonators. With greater energy conservation or Q factor, the BAW filter circuit becomes sharper and more attuned to the identification of signals corresponding to the frequency ranges it is designed to filter. Conversely, poor energy conservation or Q factor, translates into lessened performance of the filter to identify specific signals within its intended bandwidth range.

The Q factor associated with a BAW filter may vary depending on its design characteristics. Among other factors, the size and shape of the filter influences its level of resonance. Referring to FIG. 1A, a Q factor between 657-665 is determined (e.g., via analysis or simulation) to occur for a closed-loop contour line having zig-zag edges 103. The range of the Q factor is a result of the depth of the valleys of triangular shaped portions of the zig-zag edge. This results in a 16% increase in Q factor compared to conventional rectangular electrodes with smooth edges; and a Q factor that is comparable to electrodes having polygonal shaped electrodes. In FIG. 1B, a Q factor of 631 is determined (e.g., via analysis or simulation) to occur for a closed-loop contour line having zig-zag edges 103 (concave). In FIG. 1C a Q factor of 652 is determined (e.g., via analysis or simulation) to occur for the closed-loop contour line having zig-zag edges (convex). In FIG. 1D a Q factor of 640 is determined (e.g., via analysis or simulation) to occur for the closed-loop contour line having zig-zag edges (convex+concave). In FIG. 1E a Q factor of 660 is determined (e.g., via analysis or simulation) to occur for the closed-loop contour line having sinusoidal edges (curve).

In other embodiments, additional iterations may be performed within design and fabrication limits. The determined Q factor is based in part on the resulting perimeter and/or area of an electrode of a BAW resonator having dimensions of respective closed-loop contour lines of FIGS. 1A through 1E, respectively. Q factors may be calibrated for benchmarking purposes during analysis and analysis techniques may include modeling, particle counting or the like.

FIG. 2 illustrates a flowchart for a process to design an electrode with a zig-zag edge. It is noted that any of the patterns illustrated in FIGS. 1A-1E can be used. In Step 201, a triangular pulse function is defined. An algorithm is used to define a periodic triangular function (i.e., zig-zag pattern). Parameters that define the triangle wave are defined. The percentage of elements in each rising or falling section are determined. Amplitude is defined and a peak-to-peak amplitude is determined. Any vertical offset is taken into consideration. The number of replicates of the triangle is considered. Other than triangular function, other pulse function may be useful, e.g. a sinusoidal function.

In Step 203, the filter size is measured and the number of pulse function segments N is defined, with the number of segments being N>2. The electrode of FIG. 1A includes four segments (i.e., each side of the rectangular shape is considered one segment). Each segment has a defined length with a starting point and terminating at an ending point. Each line segment includes the peaks and valleys of the triangular portions along one line segment.

In Step 205, a pulse function is applied to each segment and a starting point and an ending point are determined for each segment (Step 207), including the sub-segments. In Step 209, the consecutive segments are connected such that the end point of the first segment is connected to the start point of the second segment, and the end point of the second segment is connected to the start point of the third segment, until all of the segments are connected and forming a closed loop contour with a zig-zag shaped edge, representative of an area of an electrode of a BAW resonator. In Step 211, the Q factor specifications of the rectangular shaped electrode with zig-zag edge is simulated or analyzed. If a Q factor meets specifications, the process is completed (Step 215). If the Q factor does not meet specifications, then the design is modified or customized to meet specifications (Step 217).

The pulse period of the triangular portions, amplitude of the peaks of the triangular portions can be modified or customized.

In step 309 of process 308 (FIG. 3B), whether a target Q factor, a target area and a target perimeter are met is determined for the BAW resonator based on the closed-loop contour line. As noted previously, the analysis of the closed-loop contour line is based on modeling or particle counting. Furthermore, the target Q factor, target area and target perimeter are based on specification information for the BAW resonator.

FIG. 3 is a flowchart of a process for improving the Q factor of a BAW resonator or filter with a zig-zag shape, using a computer-aided design (CAD) or electronic design automation (EDA) tool, in accordance with another exemplary embodiment. It is noted that any of the patterns illustrated in FIGS. 1A-1E can be used. In one embodiment, the process is implemented as one or more software instructions and/or for instance, in a chip set including a processor and a memory (not shown for illustrative convenience).

In step 301, a target Q factor for a resonator is defined/provided. In Step 303, the geometry of the first (top) electrode or the second (bottom) electrode (or both) is defined using a closed loop contour line with triangular function (i.e., zig-zag pattern). A multiphysics simulation of the BAW filter and Q factor extraction are performed (Step 305).

In Step 311, if a Q factor meets specifications, the pattering process of the electrode is completed. When the patterning is completed, it is used as a top electrode final shape (Step 313). If the Q factor does not meet specifications, then the design is modified or customized to meet specifications (Step 315). The triangular pulse function can be further modified or customized (Step 315). The target Q factor is based on specification information for the resonator. The final pattern for the first (top) electrode is stored as a final pattern for forming the first electrode.

A second pattern representative of an area of a second (bottom) electrode to be layered with the first electrode is provided. The layering of the second pattern and the first pattern represent an effective area of the resonator. A determination of whether the target Q factor is met for the resonator based on the area and the perimeter of the closed-loop contour is made. This may include analyzing the closed-loop contour line based on simulation/modeling. The second pattern is updated until the target Q factor is met for the resonator, the target Q factor being based on specification information for the resonator. The design characteristics of the second pattern may vary depending on the application requirements for the resonator and can have characteristics matching that of the first pattern and first electrode. Alternatively, the second pattern may be without zig-zag dimensions. The updated second pattern is stored as a final pattern for forming the second electrode. In certain instances, the storing steps may correspond to fulfillment of a design, planning, fabrication or manufacturing process. For example, the final pattern may be rendered to a photolithography processing device for enabling development of the electrode.

FIG. 4 schematically illustrates an exploded view of the three primary elements of a BAW resonator having electrodes with zig-zag edges, in accordance with a further exemplary embodiment. The BAW resonator includes a first (top) electrode 401 made of a conductive material, the electrode having a zig-zag pattern along perimeter of electrode for providing an effective area of a resonator. The area of the resonator may be defined by a closed-loop contour line representative of the area of the first electrode 401. The zig-zag edge is etched into the electrode 401 throughout its thickness for impacting standing waves resonated through an acoustic layer 403 adjacent to the first (top) electrode 401. The first electrode 401 interfaces with a first plane of the acoustic layer 403. By way of example, the acoustic layer 403 is formed of a thin-film piezoelectric material.

The BAW resonator further includes a second (bottom) electrode 405 made of conductive material. In this instance, the second electrode 405 interfaces with a second plane of the acoustic layer 403 for providing an effective area of a resonator. It is noted that the overlapping area of the first and second electrodes 401 and 405, respective 403 is sandwiched between the first and second electrodes 401 and 405, respectively.

In this instance, the second (bottom) electrode 405 is patterned to substantially match the pattern of the first (top) electrode 401. However, the second (bottom) electrode 405 can be a rectangle/square-shaped electrode without zig-zag edge. Either approach may be determined and applied accordingly depending on the desired Q factor and/or application requirements.

As a fully formed resonator having zig-zag pattern, the resonator may be further configured to one or more Bragg reflector layers that are further layered atop a substrate (not shown for illustrative convenience) in the configuration of a solidly-mounted BAW.

Alternatively, a BAW filter may include a plurality of BAW resonators (not shown for illustrative convenience). Each of the BAW resonators has one or both electrodes with a zig-zag pattern. The BAW filter may further include interconnects for operatively coupling the plurality of BAW resonators to form an acoustic filter. The interconnects may include a wire, channel or other connection point between respective BAW resonators for coupling them to one another to function as an acoustic filter. In certain embodiments, the plurality of BAW resonators may be interconnected according to any known design configurations for achieving varying operational results.

The embodiments of the present disclosure can achieve several technical effects including enabling the formation and design of BAW components with high Q and smoother frequency response relative to known BAW devices without requiring the use of supplemental components such as border rings or filaments. Rather, zig-zag patterned edges are designed and manufactured into the electrodes of a BAW resonator without the need for expanded circuitry footprint. The embodiments of the present disclosure are suitable for parameterized cell (Pcell) generation and process design kit (PDK) development. A filter platform is developed and layout implementation needs a simplified silicon compiler interface language code for Pcell. The present disclosure further enjoys a method to better design an electrode with an effective perimeter to area ratio for 'weakening' the effects of lateral modes.

Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of devices including a BAW resonator or filter, including BAW filters of the thin-film bulk acoustic resonator (FBAR), and the solidly mounted resonator (SMR) types. The present disclosure is applicable to any single-band or multi-band. RF front-end module integrating BAW filters/LNA/PA/RFSOI switches, either discrete modules (SiP) or integrated filter.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure can use various other combinations and embodiments and is capable of any changes or modifications within the scope of the inventive concept as expressed herein.

What is claimed is:

1. A device comprising:
   a bottom electrode formed over a substrate, each edge of the bottom electrode being a non-straight edge;
   an acoustic layer formed over the bottom electrode; and
   a top electrode formed over the acoustic layer, each edge of the top electrode being a non-straight edge,
   wherein an intersection of the top electrode and the bottom electrode provides an effective area of a resonator, and
   wherein the effective area of the resonator comprises a closed-loop contour line including a pulse periodic pattern with a pre-defined amplitude, period and number of repetitions of pulses along the closed-loop contour line.

2. The device according to claim 1, wherein the resonator comprises one or more longitudinal-mode BAW (bulk acoustic wave) resonators.

3. The device according to claim 2, wherein:
   the bottom electrode, the top electrode or both comprise a zig-zag shaped contour along a perimeter of the bottom electrode, the top electrode or both, or
   the bottom electrode, the top electrode or both comprise a non-parallel curve shaped contour with sinusoidal functions along a perimeter of the bottom electrode, the top electrode or both.

4. The device according to claim 3, wherein the top and bottom electrodes have a rectangular shape or a regular polygon shape, and the acoustic layer comprises a piezoelectric material.

5. The device according to claim 3, wherein the zig-zag shaped contour comprises triangular functions along the perimeter of the bottom electrode, the top electrode or both.

6. The device according to claim 1, wherein the pulse periodic pattern of the contour line comprises a concave pattern, a convex pattern or a combination of concave and convex patterns along a perimeter of the bottom electrode, the top electrode or both, wherein the top and bottom electrodes comprise a rectangular shape or a regular polygon shape.

7. The device according to claim 1, wherein each of the non-parallel edge of the bottom electrode and the top electrode comprises at least one wider protrusion or at least one wider indentation.

8. The device according to claim 1, wherein each of the non-parallel edge of the bottom electrode and the top electrode comprises a plurality of concave patterns, convex patterns or a combination of concave patterns and convex patterns.

9. A device comprising:
   a bottom electrode formed over a substrate, each edge of the bottom electrode being a zigzag edge;
   an acoustic layer formed over the bottom electrode; and
   a top electrode formed over the acoustic layer, each edge of the top electrode being a zigzag edge,
   wherein an intersection of the top electrode and the bottom electrode provides an effective area of a resonator, and
   wherein the effective area of the resonator comprises a closed-loop contour line including a pulse periodic pattern with a pre-defined amplitude, period and number of repetitions of pulses along the closed-loop contour line.

* * * * *